United States Patent
Guo et al.

(10) Patent No.: US 8,969,187 B2
(45) Date of Patent: Mar. 3, 2015

(54) SELF-ALIGNED CONTACTS

(71) Applicant: International Business Machines Corporation, Armonk, NY (US)

(72) Inventors: Dechao Guo, Wappingers Falls, NY (US); Wilfried E. A. Haensch, Somers, NY (US); Shu-Jen Han, Wappingers Falls, NY (US); Chung-Hsun Lin, White Plains, NY (US)

(73) Assignee: International Business Machines Corporation, Armonk, NY (US)

( * ) Notice: Subject to any disclaimer, the term of this patent is extended or adjusted under 35 U.S.C. 154(b) by 11 days.

(21) Appl. No.: 13/859,284

(22) Filed: Apr. 9, 2013

(65) Prior Publication Data

US 2013/0230978 A1 Sep. 5, 2013

Related U.S. Application Data

(63) Continuation of application No. 12/755,752, filed on Apr. 7, 2010, now Pat. No. 8,445,371.

(51) Int. Cl.
| | |
|---|---|
| *H01L 21/3205* | (2006.01) |
| *H01L 21/28* | (2006.01) |
| *H01L 21/768* | (2006.01) |
| *H01L 29/66* | (2006.01) |
| *H01L 29/51* | (2006.01) |

(52) U.S. Cl.
CPC .... *H01L 21/28008* (2013.01); *H01L 21/28052* (2013.01); *H01L 21/28097* (2013.01); *H01L 21/76897* (2013.01); *H01L 29/66507* (2013.01); *H01L 29/66545* (2013.01); *H01L 29/517* (2013.01)

USPC ............... 438/585; 438/586; 257/E21.19

(58) Field of Classification Search
CPC ............... H01L 21/28008; H01L 21/28052; H01L 21/28097
See application file for complete search history.

(56) References Cited

U.S. PATENT DOCUMENTS

| | | |
|---|---|---|
| 5,998,252 A | 12/1999 | Huang |
| 6,124,192 A | 9/2000 | Jeng et al. |
| 6,159,835 A | 12/2000 | Visokay et al. |
| 6,448,140 B1 | 9/2002 | Liaw |
| 6,809,027 B2 | 10/2004 | Strane et al. |
| 6,987,050 B2 | 1/2006 | Cabral, Jr. et al. |
| 7,582,563 B2 | 9/2009 | Kim et al. |
| 7,582,567 B1 | 9/2009 | Syau et al. |
| 7,615,831 B2 | 11/2009 | Zhu et al. |

(Continued)

OTHER PUBLICATIONS

Yh Lee et al., "On the Scaling of Flash Cell Spacer for Gate Disturb and Charge Retention Optimization," IEEE Transaction on Electron Devices, Sep. 2006, pp. 1959-1965, vol. 56, No. 9, IEEE.

M. Wei et al., "A Scalable Self-Aligned Cnotact NOR Flash Technology," IEEE Symposium on VLSI Technology Digest of Technical Papers, 2007, pp. 226-227, IEEE.

(Continued)

*Primary Examiner* — Daniel Whalen
(74) *Attorney, Agent, or Firm* — Cantor Colburn LLP; Vazken Alexanian

(57) ABSTRACT

A method of forming a gate structure with a self-aligned contact is provided and includes sequentially depositing a sacrificial layer and a secondary layer onto poly-Si disposed at a location of the gate structure, encapsulating the sacrificial layer, the secondary layer and the poly-Si, removing the sacrificial layer through openings formed in the secondary layer and forming silicide within at least the space formally occupied by the sacrificial layer.

19 Claims, 5 Drawing Sheets

(56) References Cited

U.S. PATENT DOCUMENTS

| | | |
|---|---|---|
| 8,445,371 B2 * | 5/2013 | Guo et al. .................... 438/585 |
| 2008/0308867 A1 | 12/2008 | Cai et al. |
| 2009/0108378 A1 | 4/2009 | Zhu et al. |
| 2009/0174002 A1 * | 7/2009 | Ouyang et al. ............... 257/369 |
| 2009/0184374 A1 | 7/2009 | Clevenger et al. |

OTHER PUBLICATIONS

Office Action dated Feb. 28, 2014 for corresponding U.S. Appl. No. 13/568,832, filed Aug. 7, 2012, 9 pages.

Office Action dated Nov. 8, 2013 for corresponding U.S. Appl. No. 13/568,832, filed Aug. 7, 2012, 10 pages.

* cited by examiner

SELF-ALIGNED CONTACTS

CROSS-REFERENCE TO RELATED APPLICATION

The present application is a continuation of and claims the benefit of priority to U.S. application Ser. No. 12/755,752, which was filed on Apr. 7, 2010 and is now allowed. The entire contents of U.S. application Ser. No. 12/755,752 are incorporated herein by reference.

BACKGROUND

Aspects of the present invention are directed to gate structures having at least partial silicidation.

In typical complementary-metal-oxide-semiconductor (CMOS) transistors, metal contacts and polysilicon gates have pitches that have become increasingly small over time as spatial and power requirements have evolved. As device pitch has decreased, a need to produce smaller and smaller spaces between metal contacts and polysilicon gates has become increasingly important. However, producing small spaces using the current photolithography alignment processes has proven to be prone to short circuits and other similar failures.

A short circuit in a gate structure may be caused, in some cases, by the contact vias at one of the source or the drain region contacting the gate. This is especially likely where the gate pitch is relatively small. One solution to this problem has been to fully encapsulate the gate to thereby prevent contact between the gate and the contact vias. Unfortunately, this solution results in the gate structure as a whole having a very high gate resistance and slow switch timing. In a memory device, which does not require fast switching capability, this is less of a drawback. However, in a logic device, which requires fast switching capability, fully encapsulated gate structures are less useful.

SUMMARY

In accordance with an aspect of the invention, a method of forming a gate structure with a self-aligned contact is provided and includes encapsulating a location of a gate structure of a channel extending between source and drain regions with lateral spacers and a secondary layer, forming silicide at the source and drain regions and introducing a conductive material into the encapsulated location through openings formed in the secondary layer.

In accordance with another aspect of the invention, a method of forming a gate structure with a self-aligned contact at a predefined location of a channel extending between source and drain regions is provided. The method includes encapsulating the predefined location with lateral spacers and a secondary layer such that an outer surface of each of the lateral spacers is disposed at a corresponding one of the source and drain regions, forming silicide at the source and drain regions and introducing a conductive material into the encapsulated location through openings formed in the secondary layer.

In accordance with yet another aspect of the invention, a method of forming a gate structure with a self-aligned contact at a predefined location of a channel extending between source and drain regions is provided. The method includes encapsulating the predefined location from a section of the source region to a corresponding section of the drain region, forming silicide at the source and drain regions and introducing a conductive material into the encapsulated location through openings formed in an encapsulating element.

BRIEF DESCRIPTIONS OF THE SEVERAL VIEWS OF THE DRAWINGS

The subject matter regarded as the invention is particularly pointed out and distinctly claimed in the claims at the conclusion of the specification. The foregoing and other aspects, features, and advantages of the invention are apparent from the following detailed description taken in conjunction with the accompanying drawings in which:

DETAILED DESCRIPTION

Figure 1:
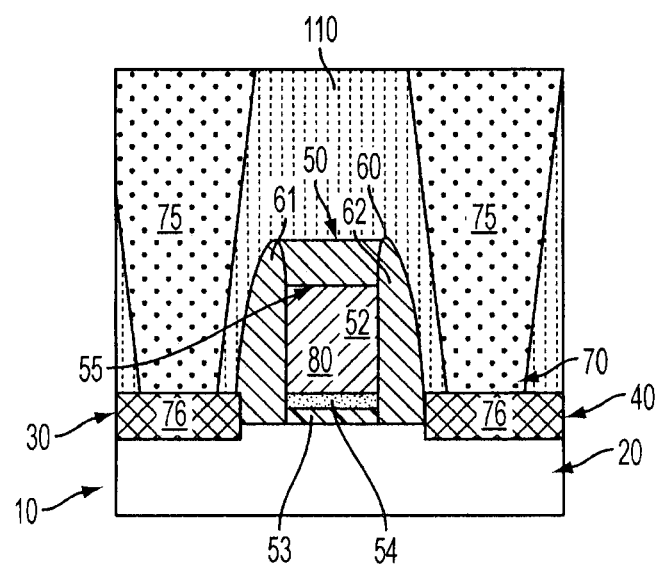
FIG. 1 is an example of a transistor gate structure in accordance with embodiments of the invention.
Figure 2:
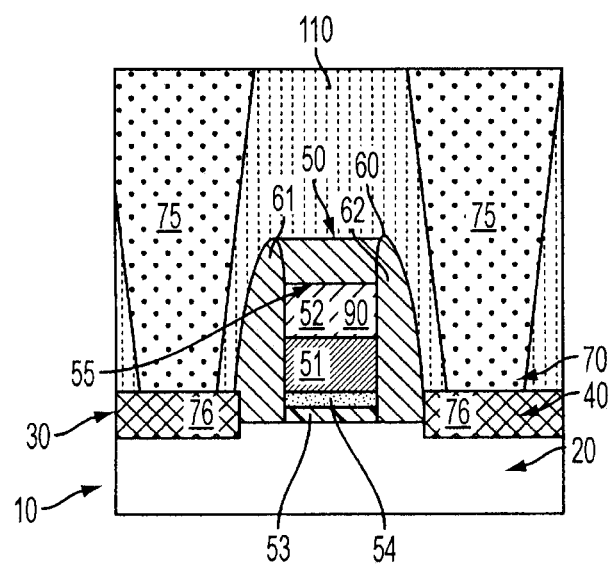
FIG. 2 is an example of a transistor gate structure in accordance with embodiments of the invention.

With reference to FIGS. 1 and 2, a gate structure including at least partial silicidation for a self-aligned contact is provided. More particularly, a transistor gate 10 is provided and includes a substrate 20, such as a silicon substrate formed as a channel, extending between a source region 30 and a drain region 40, a gate structure 50, an encapsulation assembly 60, conductive elements 70 and an insulator 110. The gate structure 50 is disposed on the substrate 20 between the source and drain regions 30, 40 and includes at least partial silicidation 80 (in FIG. 1), 90 (in FIG. 2). The encapsulation assembly 60 fully encapsulates the gate structure 50. The conductive elements 70 include contact vias 75 that are electrically coupled with additional silicide 76 formed on the substrate 20 at the source and drain regions 30 and 40.

The conductive elements 70 are insulated from the gate structure 50 by a secondary layer 55, which will be described below, the encapsulation assembly 60 and the insulator 110. In particular, the secondary layer 55 and the encapsulation assembly 60 fully encapsulate the gate structure 50 in both lateral and radial (i.e., vertical) directions. That is, the secondary layer 55 covers a top of the gate structure 50 and the encapsulation assembly encapsulates or covers all of the sides of the gate structure 50. In addition, the insulator 110 is disposed on the secondary layer 55 and all around the encapsulation assembly 60.

The secondary layer 55, the encapsulation assembly 60 and the insulator 110 may be made of any suitable electrically insulating materials as long as the insulator 110 has a different etch chemistry from that of either the secondary layer 55 or the encapsulation assembly 60. As such, during etching processes, selective etching of the insulator 110 but not the secondary layer 55 or the encapsulation assembly 60 is possible. This selective etching of the insulator 110 will not yield a short circuit of the transistor gate 10.

As shown in FIG. 2 and, in accordance with embodiments of the invention, the gate structure 50 may include layers of poly-Si 51 or some other similar composition and silicide 52. Conversely, as shown in FIG. 1 and, in accordance with embodiments of the invention, the gate structure 50 may include only silicide 52 whereby the gate structure 50 is fully silicided (FUSI). In any case, the presence of the at least partial silicidation 80, 90 in the gate structure 50 allows for full encapsulation of the gate structure 50 so as to prevent or substantially reduce an occurrence of short circuits and allows the gate structure 50 to have a relatively low gate resistance, which would not otherwise be possible. Thus, the gate structure 50 can be used in various applications, such as memory devices, in which slow switching is acceptable, and in logic devices, in which fast switching is required.

The level of silicidation 80, 90 can vary, as some devices require full silicidation (FUSI) and others require less silicidation to achieve the effects mentioned above. In most cases, however, even the minimum level of silicidation is substantial and generally exceeds 1-10% or more of the total amount of poly-Si 51. For example, in some embodiments, silicide thickness may be about 150 A (Angstroms) and, in other embodiments, the silicide thickness may be expressed as being >20 A.

The gate structure 50 may further include a high-K gate dielectric layer 53 adjacent to the substrate 20 as well as a conductive layer 54, such as a metallic layer, adjacent to the conductive layer 53 on which the poly-Si 51 and/or the silicide 52 are layered. The secondary layer 55, such as a layer of silicon nitride (SiN), is disposed on the poly-Si 51 and/or the silicide 52. The encapsulation assembly 60 includes spacers 61 and 62, such as silicon nitride/oxide (SiN or $SiO_2$) spacers, and surrounds and electrically insulates the gate structure 50. The additional silicide 76 is formed at an exterior of the encapsulation assembly 60 in contact with the substrate 20 at the source and drain regions 30 and 40. The contact vias 75 are disposed to be electrically coupled to the additional silicide at those locations while also being electrically insulated from the gate structure 50.

Figure 3:
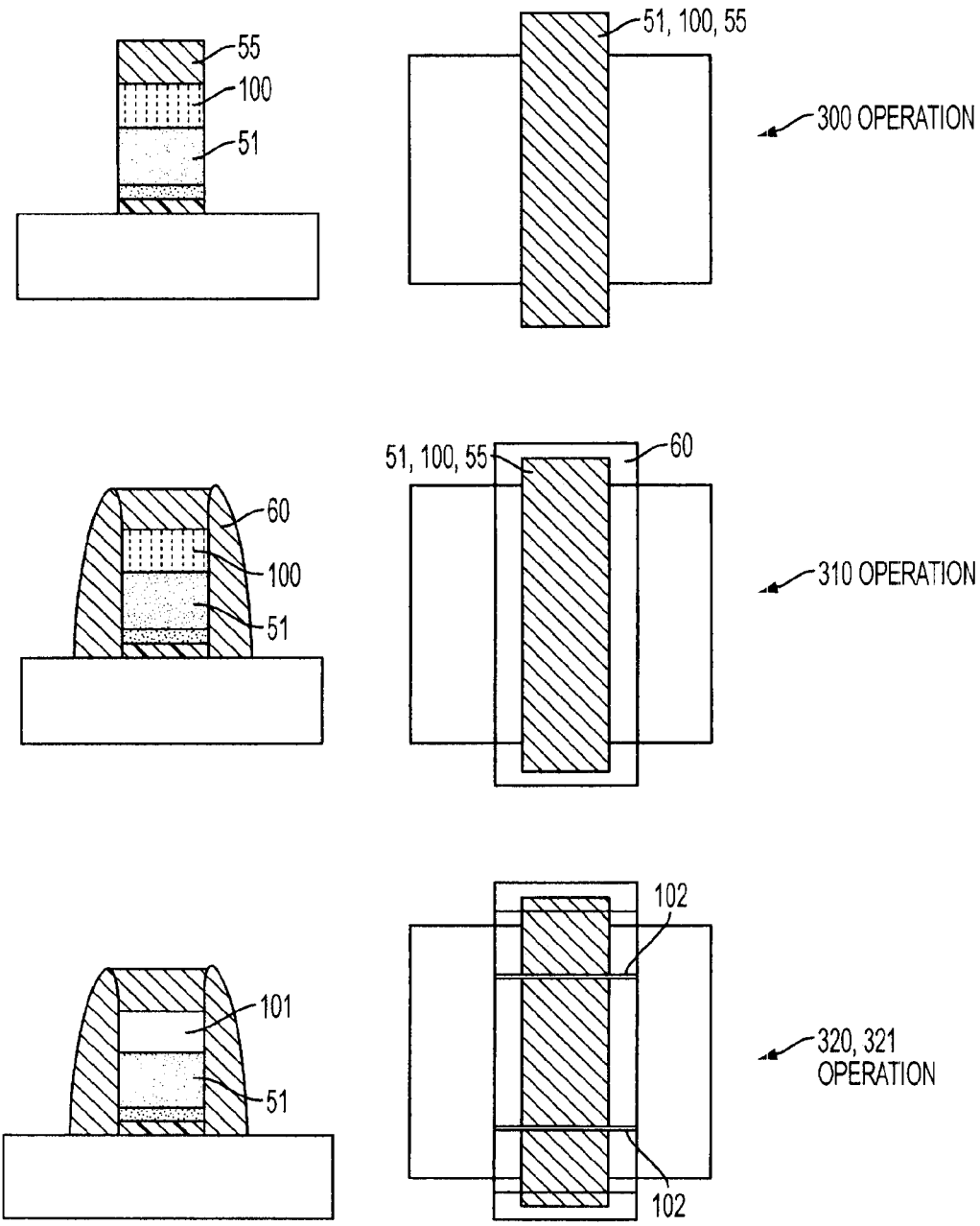
FIG. 3 shows a partial process of forming the transistor gate structure of FIG. 2.
Figure 4:
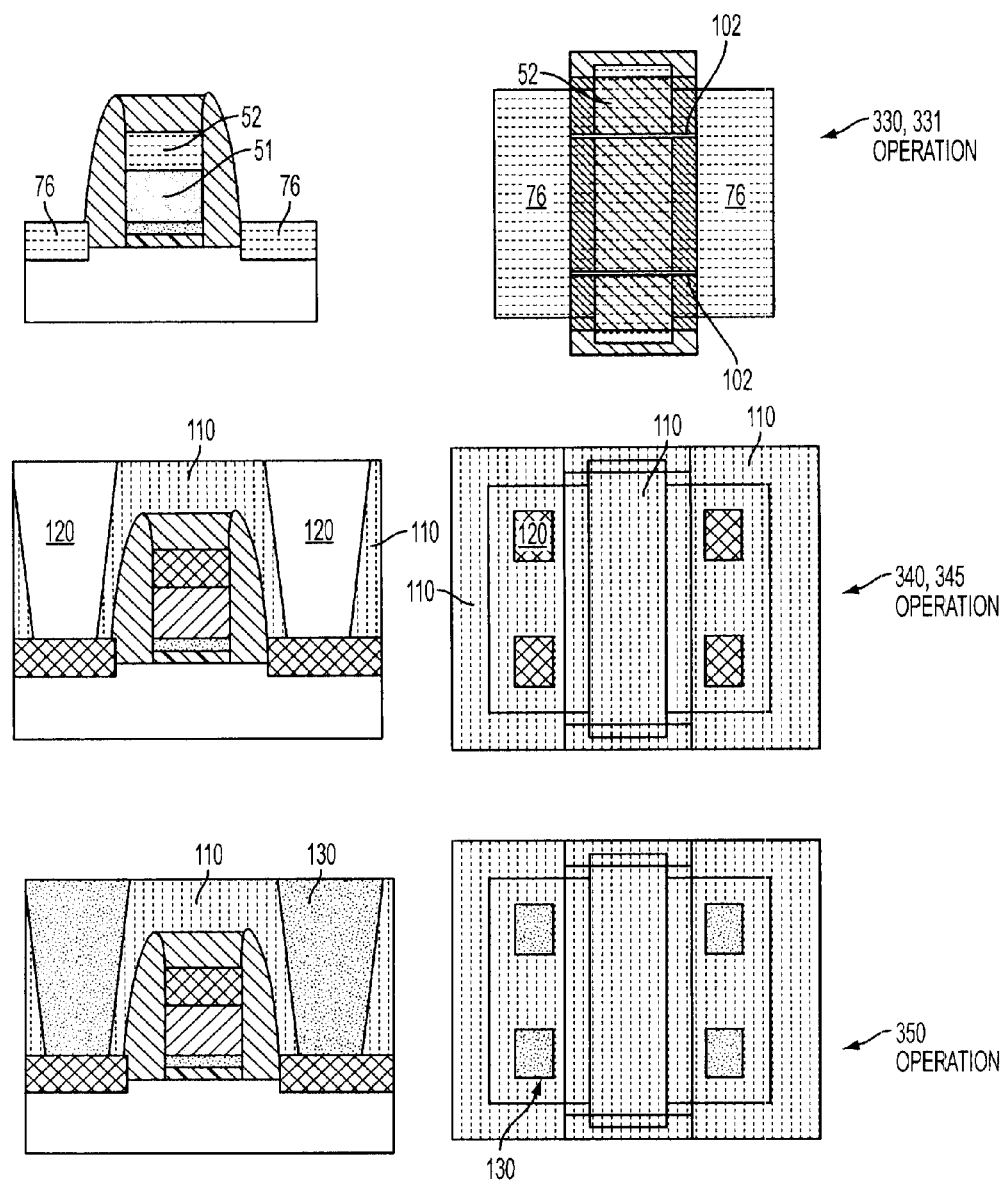
FIG. 4 shows a partial process of forming the transistor gate structure of FIG. 2.

With reference to FIGS. 3-4 a method of forming a gate structure 50 with a self-aligned contact is provided. The method, in accordance with some embodiments, includes sequentially depositing (operation 300) a sacrificial layer 100 and a secondary layer 55 onto poly-Si 51, encapsulating at least the sacrificial layer 100, the secondary layer 55 and the poly-Si 51 (operation 310), removing the sacrificial layer 100 through openings 102 formed in the secondary layer 55 (operation 320) and forming silicide within at least the space 101 formally occupied by the sacrificial layer 100 (operation 330).

The method may further include forming additional silicide 76 at the source and drain regions 30 and 40 (operation 331). The forming of the silicide 52 and the forming of the additional silicide 76 may be coupled with one another or decoupled, as in the case of FIG. 5 to be described further below. In either of these situations, the silicide 52 and the additional silicide 76 may be formed of similar materials or of materials that are different from one another.

Once the silicide 52 and/or the additional silicide 76 are formed, the method may further include depositing an insulator 110 onto the secondary layer 55, around the encapsulation assembly 60, and onto the additional silicide 76 (operation 340) such that the insulator 110 completely insulates the secondary layer 55 and the encapsulation assembly 60 in both lateral and radial directions, as mentioned above. As also mentioned above, the insulator 110 should have a different etch chemistry as that of the secondary layer 55 or the encapsulation assembly 60. Contact holes 120 at the source and drain regions 30 and 40 may then be opened (operation 345) and, subsequently, filled with contact via material 130 (operation 350). The opening of the contact holes 120 may be achieved by a selective etching of the insulator 110 whereby the different etch chemistry of the insulator 110 insures that only the insulator 110 will be removed by the etching of operation 345. As such, even if the contact holes 120 overlap with the gate structure 50, the material 130 will be insulated from the gate structure 50 by the secondary layer 55 and/or the encapsulation assembly 60, which should both remain intact.

In accordance with embodiments of the invention, the sacrificial layer 100 may include any substance that can be etched selectively, such as poly germanium (Ge) or a germanium-rich film (poly SiGe). The secondary layer 55 is an insulator, such as silicon nitride (SiN). As such, the forming of the openings 102 in the secondary layer 55 may be accomplished by way of, for example, lithographic processes. The lithographic processes respect a ground rule so that a minimum distance between the openings 102 (see FIG. 3) satisfies an aspect ratio requirement of the silicide forming operation. With the openings 102 formed, the removing of operation 320 can be achieved and may include an etching of the sacrificial layer 100 (operation 321). In some embodiments, the etchant may include hydrogen peroxide ($H_2O_2$) or some other similar composition. In particular, the etchant may be non-HF based so as to eliminate the need for a protective layer for nearby electronics.

The forming of the silicide 52 of operation 330 may include at least one of atomic layer deposition (ALD) or chemical vapor deposition (CVD) of silicide forming material, such as tungsten (W), platinum (Pt), titanium (Ti), cobalt (Co), nickel (NI) or tantalum (Ta). Deposition is followed by an annealing of the silicide forming material to generate the silicide 52. The annealing process may then be followed by removal of excess silicide forming material. In particular, it is seen that ALD provides an option of filling the space 101 by way of the openings 102 even where the openings are characterized as having relatively high aspect ratios (i.e., the openings are relatively long and thin).

Figure 5:
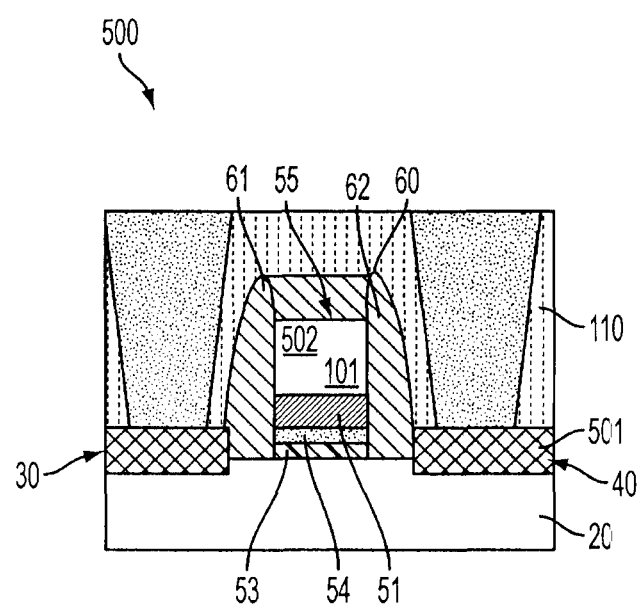
FIG. 5 is another example of a transistor gate structure in accordance with embodiments of the invention.

With reference to FIG. 5, a gate structure 500 is shown and formed in accordance with further embodiments of the invention. Here, the method includes encapsulating a location of the gate structure 500 of a substrate 20 extending between source and drain regions 30, 40 with an encapsulation assembly 60 of lateral spacers 61, 62 and a secondary layer 55. The method further includes forming silicide 501 at the source and drain regions 30, 40, and introducing a conductive material 502 into the encapsulated location through openings 102 formed in the secondary layer 55, substantially as described above. In addition, the method includes partially forming the gate structure 500 by forming a high-K gate dielectric layer 53 adjacent to the nanowire 20, forming a conductive layer 54 adjacent the high-K gate dielectric layer 53 and providing poly-Si 51 adjacent to the conductive layer 54. Space 101 is therefore defined between the poly-Si 51 and the secondary layer 55 and the introducing is achieved by at least one of atomic layer deposition (ALD) and chemical vapor deposition (CVD) with respect to the space 101.

When completed, the gate structure 500 can be insulated by the secondary layer 55, the lateral spacers 61, 62 and an insulator 110 in lateral and radial dimensions. As above, the insulator 110 should have a different etch chemistry from that of the secondary layer 55 or the spacer 61, 62 so that selective etching of the insulator 110 is possible and short circuits are avoided.

While the disclosure has been described with reference to exemplary embodiments, it will be understood by those skilled in the art that various changes may be made and equivalents may be substituted for elements thereof without departing from the scope of the disclosure. In addition, many modifications may be made to adapt a particular situation or material to the teachings of the disclosure without departing from the essential scope thereof. Therefore, it is intended that the disclosure not be limited to the particular exemplary embodiment disclosed as the best mode contemplated for carrying out this disclosure, but that the disclosure will include all embodiments falling within the scope of the appended claims.

What is claimed is:

1. A method of forming a gate structure with a self-aligned contact, the method comprising:
    encapsulating a location of the gate structure of a channel extending between source and drain regions with lateral spacers and a secondary layer disposed such that an entirety of the secondary layer is between the lateral spacers such that the encapsulated location is defined axially between the lateral spacers and radially between a radially outermost surface of the channel and a radially innermost surface of the secondary layer;
    forming silicide in the encapsulated location; and
    introducing a conductive material into the encapsulated location through openings formed in the secondary layer.

2. The method according to claim 1, further comprising forming additional silicide at the source and drain regions.

3. The method according to claim 2, further comprising decoupling the forming of the silicide in the encapsulated location and the forming of the additional silicide at the source and drain regions from one another.

4. The method according to claim 2, further comprising depositing an insulator onto the secondary layer and the additional silicide.

5. The method according to claim 4, further comprising:
    opening contact holes at the source and drain regions; and
    filling the opened contact holes with contact via material.

6. The method according to claim 1, further comprising sequentially depositing a sacrificial layer and the secondary layer onto a poly-Si layer at the location of the gate structure, wherein the sacrificial layer comprises germanium.

7. The method according to claim 1, wherein the secondary layer comprises silicon nitride.

8. The method according to claim 1, further comprising forming the openings by lithography.

9. The method according to claim 8, wherein a minimum distance between the openings satisfies an aspect ratio requirement of the silicide forming operation.

10. The method according to claim 1, wherein the forming of the silicide in the encapsulated location comprises:
    depositing silicide forming material by at least one of atomic layer deposition (ALD) and chemical vapor deposition (CVD) in a space formally occupied by a sacrificial layer; and
    annealing the silicide forming material to generate the silicide.

11. The method according to claim 10, wherein the silicide forming material comprises at least one of tungsten (W), platinum (Pt), titanium (Ti), cobalt (Co), nickel (NI) and tantalum (Ta).

12. The method according to claim 10, further comprising removing excess silicide forming material through the openings.

13. The method according to claim 1, further comprising:
    partially forming the gate structure by forming a high-K gate dielectric layer adjacent to the channel;
    forming a conductive layer adjacent the high-K gate dielectric layer; and
    providing a poly-Si layer adjacent to the conductive layer.

14. The method according to claim 13, further comprising defining a space between the poly-Si layer and the secondary layer, wherein the introducing is achieved by at least one of atomic layer deposition (ALD) and chemical vapor deposition (CVD) with respect to the space.

15. A method of forming a gate structure with a self-aligned contact at a predefined location of a channel extending between source and drain regions, the method comprising:
    encapsulating the predefined location with lateral spacers and a secondary layer disposed such that an entirety of the secondary layer is between the lateral spacers and such that the encapsulated location is defined axially between the lateral spacers and radially between a radially outermost surface of the channel and a radially innermost surface of the secondary layer with an outer surface of each of the lateral spacers disposed at a corresponding one of the source and drain regions;
    forming silicide in the at the encapsulated location; and
    introducing a conductive material into the encapsulated location through openings formed in the secondary layer.

16. The method according to claim 15, further comprising partially forming the gate structure by forming a high-K gate dielectric layer adjacent to the channel, forming a conductive layer adjacent the high-K gate dielectric layer and providing a poly-Si layer adjacent to the conductive layer.

17. The method according to claim 16, further comprising defining a space between the poly-Si layer and the secondary layer, wherein the introducing comprises at least one of atomic layer deposition (ALD) and chemical vapor deposition (CVD).

18. A method of forming a gate structure with a self-aligned contact at a predefined location of a channel extending between source and drain regions, the method comprising:
    encapsulating the predefined location from a section of the source region to a corresponding section of the drain region with lateral spacers and a secondary layer disposed such that an entirety of the secondary layer is between the lateral spacers and such that the encapsulated location is defined axially between the lateral spacers and radially between a radially outermost surface of the channel and a radially innermost surface of the secondary layer;
    forming silicide in the encapsulated location; and
    introducing a conductive material into the encapsulated location through openings formed in the secondary layer.

19. The method according to claim 18, further comprising partially forming the gate structure by forming a high-K gate dielectric layer adjacent to the channel, forming a conductive layer adjacent the high-K gate dielectric layer and providing a poly-Si layer adjacent to the conductive layer.

* * * * *